(12) United States Patent
Hara

(10) Patent No.: US 7,855,107 B2
(45) Date of Patent: Dec. 21, 2010

(54) SEMICONDUCTOR DEVICE, ELECTRO-OPTICAL DEVICE, AND METHOD FOR MANUFACTURING SEMICONDUCTOR DEVICE

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 210 days.

(21) Appl. No.: 11/771,358

(22) Filed: Jun. 29, 2007

(65) Prior Publication Data

US 2008/0012121 A1    Jan. 17, 2008

(30) Foreign Application Priority Data

Jul. 14, 2006    (JP) ............... 2006-194734

(51) Int. Cl.
*H01L 21/00* (2006.01)
(52) U.S. Cl. .............. 438/152; 438/149; 438/151; 438/155
(58) Field of Classification Search .......... 345/80, 345/90; 438/30, 149–166
See application file for complete search history.

(56) References Cited

U.S. PATENT DOCUMENTS

| 5,766,977 A | 6/1998 | Yamazaki |
|---|---|---|
| 2007/0091062 A1 * | 4/2007 | French et al. ............... 345/107 |
| 2008/0012121 A1 * | 1/2008 | Hara ........................... 257/701 |

FOREIGN PATENT DOCUMENTS

| JP | A-8-264800 | 10/1996 |
|---|---|---|
| JP | A 2002-182580 | 6/2002 |
| JP | A 2003-518756 | 6/2003 |
| JP | A-2003-295783 | 10/2003 |
| JP | A 2003-297974 | 10/2003 |
| JP | A-2004-96018 | 3/2004 |
| JP | A 2005-114915 | 4/2005 |
| JP | A-2005-259984 | 9/2005 |

* cited by examiner

*Primary Examiner*—N Drew Richards
*Assistant Examiner*—Yu-Hsi Sun
(74) *Attorney, Agent, or Firm*—Oliff & Berridge, PLC

(57) ABSTRACT

A method for manufacturing a semiconductor apparatus, the method including: aligning, on a temporal substrate, the plurality of device chips approximately in an L-shape, a plurality of groups of device chips, each group of device chips including a plurality of device chips aligned in an L-shape; arranging the plurality of groups of the device chips in a plurality of arrays on the temporal substrate, each array of device chips arranged in a band-shape, from a first long side to a second long side of the temporal substrate, a front of the band-shape being a corner of a perimeter of each group; delaminating a group of the device chips as one unit from the temporal substrate, and transferring onto the surface of the flexible substrate; and coupling each of the device chips in the group of device chips with the circuit on the flexible substrate.

12 Claims, 9 Drawing Sheets

SEMICONDUCTOR DEVICE, ELECTRO-OPTICAL DEVICE, AND METHOD FOR MANUFACTURING SEMICONDUCTOR DEVICE

BACKGROUND

1. Technical Field

Several aspects of the present invention relate to a semiconductor device, electro-optical device, and a method for manufacturing a semiconductor device.

2. Related Art

In recent years, electronic appliances that bend flexibly gained an increasing attention. Flexible displays, typically electronic papers, are light to carry, fits comfortably to one's hand, and have shock absorbability. Such apparatuses with these characteristics may potentially play an important role in ubiquitous society. Electronic devices with bendable organic thin film transistors (hereafter referred to as "organic TFT") mounted on a flexible plastic substrate have been suggested for such electronic apparatuses. Refer to JP-A-2003-518756 for an example. The organic TFT allows the forming of transistor devices at room temperature in a normal pressure, thereby reducing a manufacturing cost. Moreover, substantial manufacturing cost savings may be achieved with applying general-purpose printing techniques such as inkjet and spin coat methods.

The field-effect transport speed of organic TFTs is slower than that of other TFTs by several factors. Therefore, if all the TFTs in the electronic devices are formed with organic TFTs, the performance of those devices unfortunately declines. In order to resolve such problem, other semiconductor devices with higher field-effect transport speed may be applied for drive circuits, and the organic TFTs are used only for some parts of the electronic device.

Low-temperature polysilicon thin-film transistors (hereafter abbreviated to "LTPS-TFT"), in particular, have a high field-effect transport speed. Thus, performance thereof does not decline even when the space the transistors take up in the electronic device is reduced. Such characteristics are suitable for making the electronic devices lighter and thinner, meeting the needs for resolving the above problem. However, a high temperature of 600° C. is required for manufacturing such LTPS-TFTs, making it difficult to form those LTPS-TFTs on a plastic substrate used for flexible devices.

The above problem is solved by a packaging technique called Surface-Free Technology by Laser Ablation/Annealing (SUFTLA; a registered trademark of Seiko Epson Corp.), in which the LTPS-TFTs created in advance on a glass substrate are transferred on a plastic substrate. Refer to JP-A-2003-297974 as an example of related art.

Referring now to FIG. 10, prior to the transfer step in SUFTLA, a plurality of device chips 4 to be transferred is formed in advance on a glass substrate 22, so that they are aligned in the same arrangement on the plastic substrate. FIG. 10 is a schematic plan view of the glass substrate 22 on which the device chips 4 are formed. An area R indicated in a dotted line is the area to be transferred to the plastic substrate in the single SUFTLA process. Generally, a pixel is formed in the center of the area R, constituting a display area. Thus, the device chips 4 are aligned in the perimeter of the area R, creating a dead space in a region in which the device chips 4 are not disposed. This significantly limits the number of device chips 4 that can be disposed in proportion to the area of the glass substrate 22, involving the problems of manufacturing cost increase, massive consumption of materials and energy, and imposition of substantial burden on the environment.

SUMMARY

An advantage of the invention is to provide a method for manufacturing a semiconductor apparatus that allows reduction in manufacturing cost, by organizing an array of device chips formed on a substrate, from which the device chips are transferred in a SUFTLA transfer process, so that the substrate of origin in the transfer is utilized effectively without wastage.

According to a first aspect of the invention, a method for manufacturing a semiconductor apparatus including a plurality of device chips aligned approximately in an L-shape at the perimeter of the two adjacent sides of a flexible substrate and a circuit coupled with the device chip, the method includes: aligning, on a temporal substrate, the plurality of device chips approximately in an L-shape, in an arrangement as on a surface of the flexible substrate, so as to form a group of device chips, and arranging a plurality of arrays of device chips on the temporal substrate, each array of device chips formed by the plurality of groups of device chips arranged in a band-shape, from one long side to the other long side of the temporal substrate, each L-shape formed by the group of device chips pointing towards the same direction, a front of the band-shape being a corner of a perimeter of the group; delaminating the group of device chips as one unit from the temporal substrate, transferring onto the surface of the flexible substrate; and coupling each of the device chips in the group of device chips with the circuit on the flexible substrate.

According to the above aspect of the invention, the device chips are arrayed in advance on the temporal substrate, so as to form a group of device chips to be aligned on the target substrate to which the device chips are transferred. At the same time, the L-shapes formed by the device chips are aligned, pointing towards the same direction, in a manner that there are no dead spaces between the device chips. Moreover, the group of device chips is arrayed into a band of device chips, the front of the band being a corner of a perimeter of the group. A number of such device chip arrays are aligned without overlapping with one another. This way, a large number of device chips can be formed on the temporal substrate. At the same time, a single group of device chips is delaminated and transferred as one unit. Consequently, many groups of device chips are collected from a single temporal substrate, allowing a minimal usage of material and energy, thereby reducing a manufacturing cost.

According to a second aspect of the invention, a method for manufacturing a semiconductor apparatus including a plurality of device chips aligned approximately in an L-shape at the perimeter of the two adjacent sides of a flexible substrate and a circuit coupled with the device chip, the method includes: forming a plurality of device chips in an alignment on the temporal substrate; selecting one group of device chips from the plurality of device chips in order for the alignment thereof to approximately form an L-shape, as well as delaminating and transferring the group of device chips as one unit onto the flexible substrate; and coupling each of the device chips that are transferred with the circuit.

According to the above aspect of the invention, a group of device chips are selected from the multitude of device chips formed on the surface of the temporal substrate, in a manner that the group forms an approximately L-shaped group. Tin other words, the shape of the group is in the alignment of the substrate to which the device chips are transferred. Therefore, the group of device chips can be transferred so as to form a desired alignment, regardless of how the alignment of the groups of device chips on the temporal substrate is. Moreover, multiple device chips can be formed on the temporal substrate, increasing the number of transfers originated from a single temporal substrate. This suppresses the usage of material and energy, consequently reducing the manufacturing cost. Further, the above method does not require the device chips to be laid out on the substrate to which the devices are transferred, when forming, prior to the transfer, the device chips on the temporal substrate. The device chips are simply required to be formed in order. The formation of the mask for forming the device chip is therefore simplified.

According to a third aspect of the invention, a method for manufacturing a semiconductor apparatus including a plurality of device chips aligned approximately in an L-shape at the perimeter of the two adjacent sides of a flexible substrate and a circuit coupled with the device chip, the method includes: forming a plurality of device chips in an alignment on the temporal substrate; selecting two rows of groups of device chips from the device chips, an alignment of each row being linear, and delaminating and transferring one group of device chips onto the surface of the flexible substrate, so as to form a first row of device chips on the flexible substrate; moving any one of the temporal substrate and the flexible substrate to a position where the device chips are disposed, the position approximately forming an L-shape together with the first array of device chips; delaminating and transferring the other group of device chips onto the surface of the flexible substrate, so as to form a second row of device chips on the flexible substrate; and coupling each of the device chips in the first and the second rows of device chips with the circuit on the flexible substrate.

Since the transfer process separated into two, each group of device chips transferred in each process takes a linear shape. This increases the degree of freedom when selecting the device chips to be transferred from the temporal substrate, allowing even more efficient usage of the device chips formed on the temporal substrate. Moreover, by moving the temporal substrate or the flexible substrate, the direction of a laser scanning in the transfer process can be set to one direction.

In this case, it is desirable that the method for manufacturing a semiconductor substrate further include adhering a support substrate to a back surface of the flexible substrate, prior to transferring the group of device chips to the flexible substrate.

This reduces the warp or the swell of the flexible substrate in each manufacturing process, thereby improving the precision of an alignment, as well as the easiness in handling of the substrates. The above method is effective to a great extent particularly in the alignment in the transfer process of a drive circuit from the temporal substrate to the surface of the flexible substrate, in particular, the alignment in the instilment of the adhesive agent.

According to a fifth aspect of the invention, a semiconductor apparatus in the invention is manufactured by the above-referenced manufacturing method. A semiconductor apparatus according to this aspect of the invention is provided with an excellent drive characteristic and flexibility achieved at low-cost.

According to a sixth aspect of the invention, an electro-optical apparatus in the invention is provided with the aforementioned semiconductor apparatus. An electro-optical apparatus according to this aspect of the invention is therefore provided with an excellent drive characteristic and flexibility achieved at low-cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of a semiconductor apparatus, an electro-optical apparatus, and a method for manufacturing a semiconductor apparatus will now be described, with reference to FIGS. 1A through 9.

These embodiments merely represent some of the embodiments of the present invention, and the invention is not limited thereto. Any modification of these embodiments is allowed, as long as it falls within the main technical scope of the invention. Figures shown hereafter have different scale size for each of the layers and components, so that each of them will have a size large enough to be recognized in the figures.

Semiconductor Apparatus

Figure 1A:
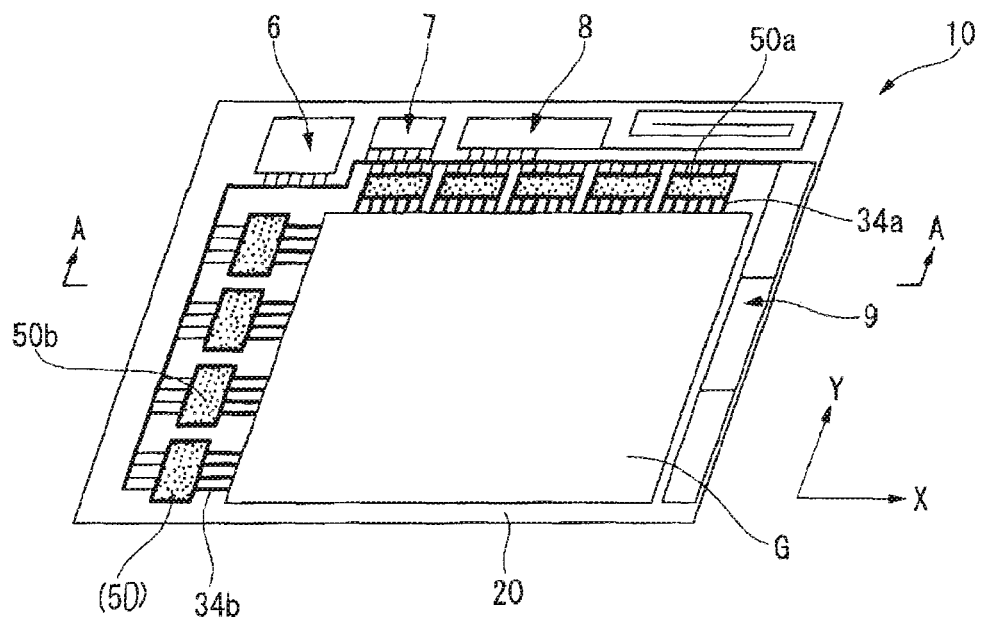
FIG. 1A is a schematic plan view of one embodiment of a semiconductor apparatus obtained by a manufacturing method according to one aspect of the invention.
Figure 1B:
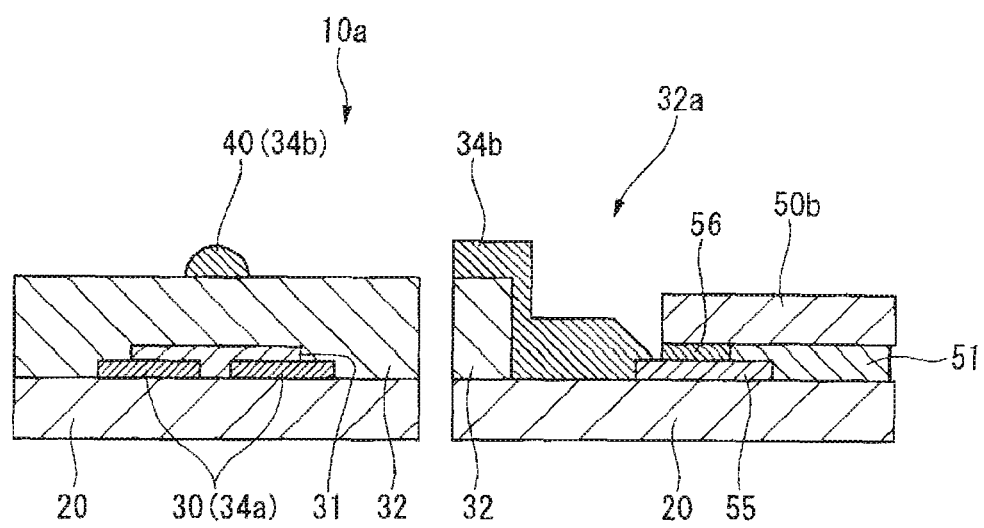
FIG. 1B is a schematic sectional view of one embodiment of the semiconductor apparatus obtained by the manufacturing method according to one aspect of the invention.

Referring now to FIGS. 1A and 1B, the structure of a semiconductor apparatus will be described.

FIG. 1A is a schematic plan view of one embodiment of a flexible display using a semiconductor apparatus 10 obtained by a manufacturing method according to one aspect of the invention. This flexible display has a display area G formed on a flexible substrate 20, and the display area G includes un-illustrated organic TFTs as active devices. The following components are disposed to the periphery of the display area G, the components including: a plurality of drive circuits 50a and 50b for driving the organic TFTs; a CPC 6 connected to these drive circuits 50a and 50b; RAM 7; an analog/RF 8; and a solar battery 9.

The drive circuits 50a and 50b are device chips including LTPS-TFTs, and are disposed in a row and a column (array of device chip) along the directions of X and Y in the drawing, gathered at the perimeter of the two adjacent sides of the flexible substrate 20. The drive circuits 50a and 50b are fixed to the flexible substrate 20 by an adhesive. No particular limitation is imposed on the detailed structure of the drive circuits 50a and 50b. However, drive circuits including LTPS-TFT are preferable, since a high-speed field effect is obtained therewith, thereby achieving a high-speed drive, and the space of the circuits, in proportion to that of the flexible substrate 20, is smaller.

The flexible substrate 20 may be, not limited by its transparency or non-translucency, formed with various materials. The plastic substrate is employed in the embodiment as a substrate that particularly excels in flexibility. Examples of materials with which the plastic substrate (resin substrate) is composed with include: polyethylene terephthalate (PET), polyethylene naphthalate (PEN), polyether sulphone (PES), polycarbonate (PC), aromatic polyester (liquid crystal polymer), and polyimide (PI). As long as the substrate has flexibility, other materials such as glass, silicon, metal, and gallium arsenide may also be employed for the flexible substrate.

Data lines 34a are interconnections extending in the display area G in the Y direction in FIG. 1, and are coupled with the sources of the organic TFTs in the display area G. At the same time, the data lines 34a are electrically coupled with the drive circuits 50a at the position extended out from the display area G in the Y+ direction. Scanning lines 34b are interconnections extending in the display area G in the X direction in FIG. 1, and are coupled with the gates of the organic TFTs in the display area G. At the same time, the scanning lines 34b are electrically coupled with the drive circuits 50b at the position extended out from the display area G in the X-direction. The drive circuits 50a supply electricity to the data lines 34a of the organic TFTs, and the drive circuits 50b supply drive signals to the scanning lines 34b, thereby actively driving the organic TFTs.

An organic TFT 10a will now be described with reference to FIG. 1B. FIG. 1B is a sectional view of main parts at a position along the line A-A' in FIG. 1A. The organic TFT 10a is a switching device formed mainly with wet type film deposition as described later. It is referred to as a top-gate transistor, having source and the drain electrodes 30, an organic semiconductor layer 31, an insulation layer 32, and a gate electrode 40, deposited in that order from the side of the flexible substrate 20. Moreover, an un-illustrated pixel electrode is provided corresponding to the organic TFT 10a, and is electrically coupled with the drain electrode 30 trough a contact hole.

The description is made for a top gate structure in this embodiment. However, the structure of the transistor is not limited thereto, and may also be a bottom gate structure.

The gate electrode 40 and the organic TFT 10a include a plurality of gate electrodes 40 and organic TFTs 10a. The gate electrodes 40 of the organic TFTs 10a are electrically coupled with the scanning lines 34b that extend in the X direction of the flexible substrate 20, the gate electrodes 40 being connected directly to the scanning lines 34b or having other interconnections therebetween. The gate electrodes 40 are also electrically connected to terminals 56 of the drive circuits 50b through contact units 55 formed in the perimeter of the flexible substrate 20. The insulation layer 32 of the organic TFTs 10a has a step 32a at the periphery of the organic TFTs 10a. Therefore, the scanning lines 34b formed on the insulation layer 32 extend along the step 32a, covering the surface of the insulation layer 32 and reaching out to the contact units 55. The contact units 55 are metal pads or the like, formed on the flexible substrate 20, and are disposed on the interconnections. The drive circuits 50b are fixed to the flexible substrate 20 with an adhesive 51. The terminals 56 of the drive circuits 50b formed on the surface facing the flexible substrate 20 are electrically connected to the contact units 55, and abut the contact units 55 on the flexible substrate 20.

The source electrode 30 of the organic transistor 10a is coupled with each of the data lines 34a that extends along the Y direction of the flexible substrate 20, the source electrode 30 being connected directly to each of the data lines 34a or having other interconnections therebetween (illustration omitted in FIG. 1B). The terminal of each of the data lines 34a is connected to the terminal provided to each of the drive circuits 50a. Here, the source electrode 30 and each of the data lines 34a are formed in the layer under the insulation layer 32. Therefore, each of the data lines 34a is extended out from between the flexible substrate 20 and the insulation layer 32 in the Y+ direction in FIG. 1A, and the part extending out therefrom becomes a contact terminal.

Manufacturing Method of Semiconductor Apparatus

First Embodiment

A first embodiment of the method for manufacturing a semiconductor apparatus 10 will now be described with reference to FIGS. 2A through 2G. FIGS. 2A through 2G describes processes for manufacturing the semiconductor apparatus 10, all of which correspond to the sectional view of the semiconductor apparatus 10 illustrated in FIG. 1A.

Figure 2A:
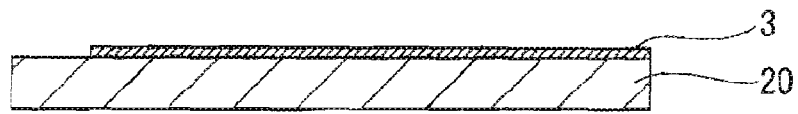
FIG. 2A describes a process of the manufacturing method according to one aspect of the invention.

As shown in FIG. 2A, a metal film pattern 3 is formed on the flexible substrate 20, as a first layer interconnection. The metal film pattern 3 includes conductive interconnections shown in FIG. 1B, such as the source and the drain electrodes 30, the data lines 34a, and the contact units 55. All the above interconnections disposed directly above the flexible substrate 20 are patterned all together.

In this process, a certain portion of the scanning lines 34b is not patterned together with above metal film pattern 3 and is left blank, since it is to be deposited not in the bottom layer but on another layer. Instead, the contact units 55 coupled with the scanning lines 34b is formed.

No particular limitation is imposed on a method for forming the metal film pattern 3. However, a liquid-phase process is preferable. In the liquid-phase process, a liquid material is selectively disposed on the flexible substrate 20, and then dried and solidified, so as to form the metal film pattern 3. An example of the liquid material is a disperse liquid, a resultant of which conductive particles are mixed into a solvent. Examples of the conductive particles include: metals such as Cr, Al, Ta, Mo, Nd, Cu, Ag, Au, Pd, In, Ni, and Co; alloys using those metals; various known metal materials; and alloys and oxides thereof. Known conductive organic materials such as polyethylene-dioxythiophene (PEDOT) or metal choroids may also be used. The main component of the disperse liquid is water. A fluid to which alcohol is added may also be used as the disperse medium, Methods for coating the substrate with droplets include methods such as spin coating, slit coating, dip coating, spraying, roll coating, curtain coating, printing, and droplet ejection. The droplet ejection, in particular the inkjet method, is preferable. The inkjet method allows a direct patterning on the flexible substrate 20, allowing a film deposition only for the necessary portions. Therefore, a manufacturing process may be substantially simplified and the film deposition may be carried out in a mild condition (under the atmospheric pressure).

An underlying insulation film such as a silicon oxide film ($SiO_2$) may be formed on the surface of the flexible substrate 20. In the first embodiment, a structure with a single layer interconnection pattern is described, while it may also be a two or a three layered structure.

With the inkjet method, the liquid material is ejected to the predetermined positions on the flexible substrate 20, by a moving mechanism for moving the un-illustrated inkjet head relative to the flexible substrate 20. The pattern drawn by the ejection of liquid material is formed based on the electronic data such as a bitmap pattern stored in the droplet discharge apparatus. Therefore, the liquid material can be coated on the desired positions only by preparing the electronic data. The methods applied for the inkjet head include a piezoelectric method and a thermal method, the piezoelectric method ejecting droplets by changing the volume of the ink cavity with the piezoelectric device, and the thermal method ejecting droplets by the bubbles generated by heating the ink inside the ink cavity. The piezoelectric method is preferable since there is no effect caused by heat.

Figure 2B:
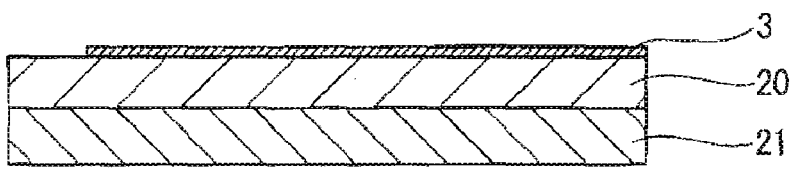
FIG. 2B describes a process of the manufacturing method according to one aspect of the invention.

Referring now to FIG. 2B, a support substrate 21 is adhered to the back surface of the flexible substrate 20, in other words, the side where the metal film pattern 34 is not formed. This allows the handling of the flexible substrate 20 as a rigid substrate in the later-described manufacturing processes. Moreover, the alignment precision in each process is increased, since the warp or swell of the flexible substrate 20 is reduced. Therefore, adhering the support substrate makes the alignment of the transfer process substantially more effective, drive circuits being transferred from the temporal substrate to the surface of the flexible substrate. In particular, the alignment in the instilment of the adhesive agent in the Surface-Free Technology, by Laser Ablation/Annealing (SUFTLA; a registered trademark) process described in detail later.

FIGS. 2C through 2F describes processes for transferring the drive circuits 50 to the flexible substrate 20 (hereafter, the drive circuits 50a and 50b are also collectively referred to as "drive circuits 50"). Known techniques are employed in these transfer processes. In this embodiment in particular, SUFTLA (a registered trademark) is used.

Figure 2C:
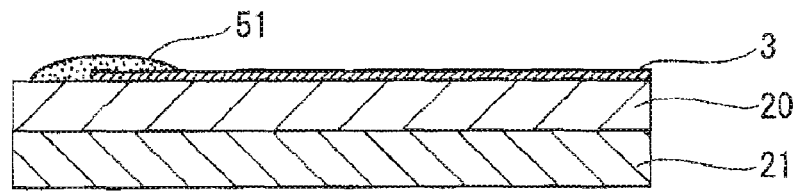
FIG. 2C describes a process of the manufacturing method according to one aspect of the invention.

As shown in FIG. 2C, the adhesive 51 is instilled on the surface of the flexible substrate 20. This adhesive 51 fixes the drive circuits 50 to the flexible substrate 20, and may also be provided with a functionality to electrically couple the terminals 56 of the drive circuits 50 to the contact units 55 of the metal film pattern 3. That is to say, the adhesive 51 may also be used as an anisotropic conductive paste (ACP) including the conductive particles. Here, since the support substrate 21 is adhered to the back surface of the flexible substrate 20, the surface thereof is flat without warp or swell. Moreover, the alignment of the substrates can be carried out quickly and precisely when coating the flexible substrate 20 with the adhesive 51, since rigidity is provided to the flexible substrate 20 by the support substrate 21.

Figure 2D:
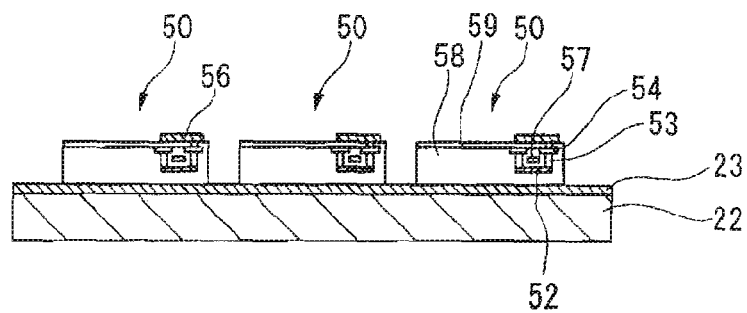
FIG. 2D describes a process of the manufacturing method according to one aspect of the invention.

Referring now to FIG. 2D, aside from the flexible substrate 20 described above, the drive circuits 50 to be transferred are formed on a temporal substrate 22 using known techniques including high-temperature process. A delaminating layer 23 is formed on the temporal substrate 22, and the drive circuits 50 are formed on this delaminating layer 23.

The temporal substrate 22 is not a constituting member of the semiconductor apparatus 10, but a member used only for the manufacturing process of the drive circuits 50 and the transfer process thereof to the flexible substrate 20. A translucent, heat-resistant substrate that tolerates the temperature of 1000° C., such as quartz glass, is preferable. Besides the quartz glass, other heat-resistant substrates may be used, such as soda glass, Corning7059, Nippon Electric Glass OA-2. There is no strict limitation imposed to the thickness of the temporal substrate 22. However, the preferable range of the thickness is approximately 0.1 mm to 0.5 mm, in particular, a range approximately from 0.5 mm to 1.5 mm is preferable. If the temporal substrate 22 is too thin, then the strength thereof declines, and if it is too thick and if the translucency of the base is low, then the irradiated light is attenuated. If the base that is highly translucent to the irradiated light is used, the thickness thereof may be increased exceeding the upper limit described above.

The delaminating layer 23 is composed with a material with which a delamination of inner layer or of a surface (also referred to as "inner-layer delamination" or "interfacial delamination") is caused by the irradiated light such as a laser light. In other words, by irradiating a certain intensity of light, the bonding between atoms or molecules constituting the constituent material disappears or declines, causing an ablation, resulting in a delamination. There are two reactions caused by the light irradiation. In one reaction, the component contained in the delaminating layer 23 becomes a gas and the gas is released, thereby the delaminating layer 23 is separated. In the other reaction, the delaminating layer 23 itself is absorbed by the light, turning into a gas and the gas is released, resulting in its separation.

An example of the composition of the delaminating layer 23 includes an amorphous silicon (a-Si). Hydrogen (H) may preferably be included in the amorphous silicon, since an internal pressure in the delaminating layer 23 caused by the release of hydrogen gas generated by the light irradiation promotes the delamination. The preferable content of hydrogen in this case is approximately 2 at % or more, particularly, approximately from 2 to 20 at %. The amount of hydrogen is adjusted by the condition of film deposition. For instance, if the CVD method is used, the adjustment is done by optionally setting the conditions such as: composition, pressure, atmosphere, flow rate, and temperature of the gas; a substrate temperature; and an input power.

Other examples of materials of the delaminating layer 23 include: silicon oxide or silica compounds; nitride ceramics such as silicon nitride, aluminum nitride, and titanium nitride; organic polymer materials in which the atomic bond therebetween is cut by light irradiation; metals such as Al, Li, Ti, Mn, In, Sn, Y, La, Ce, Nd, Pr, Gd, and Sm; and alloys containing at least one of the described metals.

The preferable thickness of the delaminating layer 23 is approximately from 1 nm to 20 µm, in particular, 10 nm to 2 µm. More specifically, a range approximately from 20 nm to 1 µm is preferable. If the delaminating layer 23 is not thick enough, then the uniformity in the thickness of the formed film is lost and the delamination becomes uneven. If the delaminating layer 23 is not thin enough, then the power of irradiated light necessary for delamination (quantity of light) may need to be increased, or, the removal of residue of the delaminating layer 23 may take time.

The method for forming the delaminating layer 23 may optionally be selected in accordance with various conditions such as composition or thickness of the delaminating layer 23, as long as the method allows the forming of the delaminating layer 23 with uniform thickness. Examples of the method applicable for forming the delaminating layer 23 include: various vapor phase depositions, such as CVD methods (including metal organic chemical vapor deposition (MOCCVD), low-pressure CVD, and electron cyclotron resonance CVD (ECR-CVD)), vapor deposition, molecular beam deposition (MB), sputtering, ion doping, and physical vapor deposition (PVD); various platings such as electroplating, immersion plating (dipping), and electroless plating; coatings such as Langmuir-Blodgett (LB), spin coating, spray coating, and roll coating; various printing method; transferring method; inkjet method; and powder jet method. These methods may be used in combination of two or more.

If the delaminating layer 23 is composed with amorphous silicon (a-Si), the CVD method, in particular, a low-pressure CVD or plasma CVD is preferable for the film deposition. If the delaminating layer 23 is deposited with sol-gel method using ceramics, or if the delaminating layer 23 is composed with an organic polymer material, the coating method, particularly the spin coating method is preferable.

The drive circuits 50 is formed including a semiconductor layer 52, a gate electrode 57, and source and drain electrodes 54, all of which are deposited in that order from the temporal substrate 22. These layers are isolated by an interlayer insulation film 58, and the top surface of those layers are covered with a protection layer 59. The terminals 56 that serves as the interface with external units are bumps formed on the top layer on the protection layer 59, and are connected to the contact units 55 of the data lines 34a or of the scanning lines 34b.

The drive circuits 50 are formed on the delaminating layer 23. The drive circuits 50 can be manufactured with known techniques. For instance, they are manufactured with the following processes.

First, a part of the interlayer insulation film 58 is deposited on the temporal substrate 22 on which the delaminating layer 23 is formed, and thereafter the underlying insulation layer is formed as a protection layer of the delaminating layer 23. $SiO_2$, for instance, may be used for the underlying insulation layer. This underlying insulation layer may be formed with a known film deposition method such as the plasma CVD.

Thereafter, the amorphous silicon film is formed on the underlying insulation layer with PECVD method using $SiH_4$, or with LPCVD method using $Si_2H_6$. The amorphous silicon crystallizes and becomes a polycrystalline silicon film with a laser irradiation, thereby the semiconductor layer 52 is obtained. Subsequently, this polycrystalline silicon film is patterned, and the gate insulation film is deposited, followed by the deposition and the patterning of the gate electrode 57. Dopants such as phosphorus and boron are implanted to the polycrystalline silicon in self-alignment with the gate electrode, and then activated, so as to form a source region and a drain region of the CMOS structure. The interlayer insulation film 58 is deposited, a contact hole 53 is opened, and the source and drain electrodes 54 are patterned. The protection layer 59 is formed so as to cover the above, thereby the drive circuits 50 provided with LTPS-TFT are obtained.

Figure 3:
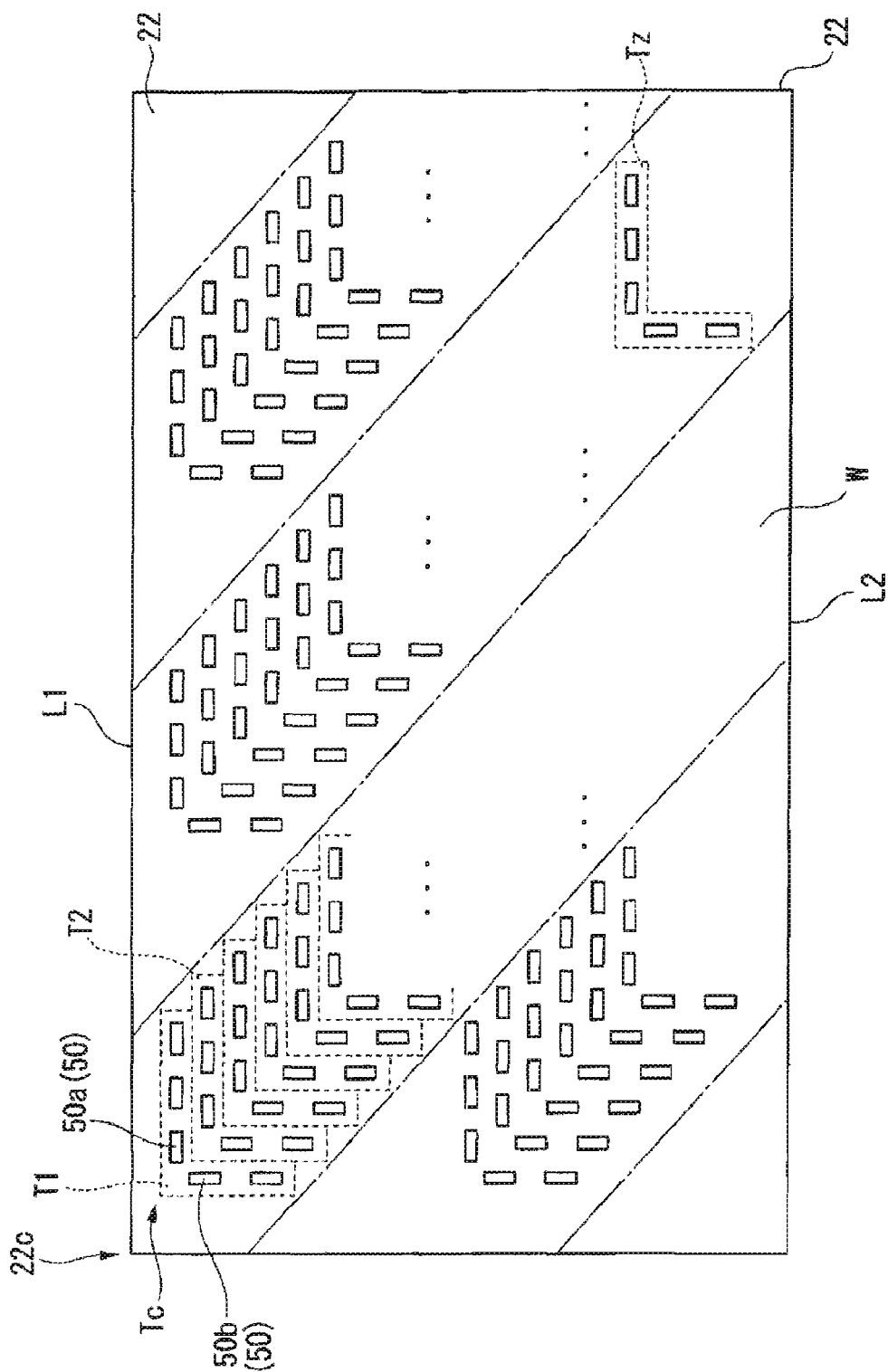
FIG. 3 is a schematic block diagram of a temporary substrate used in one embodiment of a manufacturing method according to one aspect of the invention.

It is desirable to form on the temporal substrate 22 as many drive circuits 50 as possible. Carrying out many transfers from a single temporal substrate avoids the redundancy of material and of manufacturing process, allowing the manufacturing of semiconductor apparatuses with improved energy conservation. One embodiment of the array pattern of the drive circuits 50a and 50b on the temporal substrate 22 is shown in FIG. 3. FIG. 3 is a schematic plan view of the temporal substrate 22, viewed from the side on which the drive circuits 50a and 50b are formed.

In the first embodiment, the drive circuits 50a and 50b are arrayed corresponding to the alignment thereof on the flexible substrate 20 to which those circuits 50a and 50b are transferred. As described, the drive circuits 50a and 50b are arrayed approximately in an L-shape at the perimeter of the two adjacent sides of the flexible substrate 20. These drive circuits 50a and 50b, aligned approximately in an L-shape, constitute a single group of device chips T. The group of device chips T includes the plurality of groups of device chips T. These groups of device chips T are arrayed on the temporal substrate 22. Referring back to FIG. 3, the area formed by one group of device chips T is indicated in a dotted line.

In order to dispose more groups of device chips T on the temporal substrate 22, the outer shapes of the L-shapes formed by the groups of device chips T are aligned pointing towards the same direction, preferably without creating gaps between the groups of device chips T. In other words, the adjacent groups of device chips T1 and T2 are aligned so that the long sides as well as short sides of those L-shapes are respectively parallel to each other. Moreover, the long side of the temporal substrate 22 and the long side of the L-shape in which the group of device chips T is arranged are in parallel. At the same time, the group of device chips T1, T2, . . . are arrayed in a band from the long side L1 to the other long side L2 of the temporal substrate 22, so as to form an array of device chips W. Referring back to FIG. 3, this array of device chips W is indicated in a dash-dotted line.

The array of device chips W is formed including a plurality of groups of device chips T. Here, a corner 22c of the temporal substrate 22 and a curvature Tc of the L-shaped group of device chips T both points toward the same direction. Moreover, as many groups of device chips T as possible are arrayed into a band of device chips, without overlapping with one another. Here, the group of device chips T1 positioned closest to the corner 22c is at the front of the band. The array of device chips W includes a plurality of arrays of device chips W. These arrays of device chips W are aligned in several lines on the temporal substrate 22. This allows the forming of the excessively large number of groups of device chips T on the temporal substrate 22, thereby allowing multitude of transfers from a single temporal substrate.

Figure 2E:
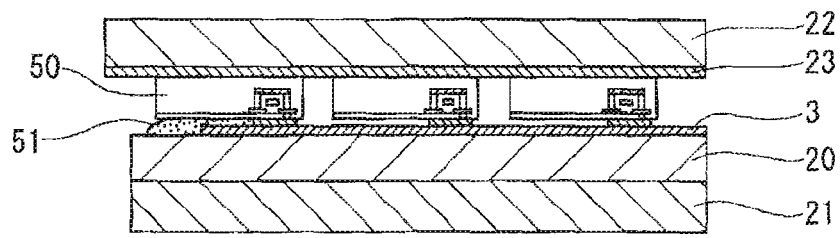
FIG. 2E describes a process of the manufacturing method according to one aspect of the invention.

As shown in FIG. 2E, the temporal substrate 22 is inverted, and the temporal substrate 22 and the flexible substrate 20 are positioned so that the terminals 56 of the drive circuits 50 face the metal film pattern 3. Here, in the manufacturing method according to the first embodiment, a sufficient pressure is impressed to both the flexible substrate 20 and the temporal substrate 22, since the support substrate 21 is adhered to the back surface of the flexible substrate 20. The flexible substrate 20 does not warp nor swell even such pressure is impressed. At this time, heat may be applied in order to harden the adhesive 51.

In a single transfer process, a single group of device chips T is transferred as a unit. No particular limitation is imposed on the sequence of the groups of device chips T. Preferably, the first one to transfer may be a group of device chips Tz positioned at the opposite side of the direction the curvature Tc in the group of device chips T points toward on the temporal substrate 22. The group of device chips Tz is disposed at the farthest position from the group of device chips T1 positioned at the front of the first array of the device chips W. The metal film pattern 3 is already formed on the target of the transfer, i.e., the flexible substrate 20. Therefore, if the transfer is carried out from the front of the array of device chips W (from the side of the corner 22c), then the group of device chips T disposed in the rear part of the array may contact the metal film pattern 3.

Figure 2F:
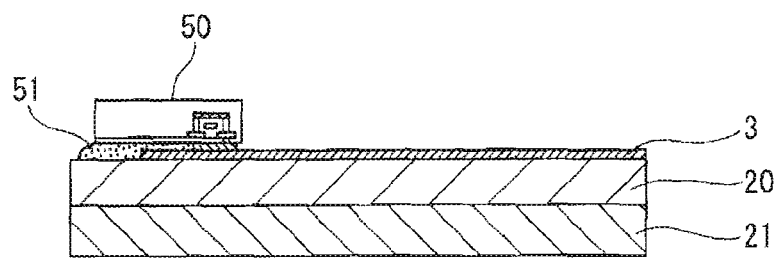
FIG. 2F describes a process of the manufacturing method according to one aspect of the invention.
Figure 2G:
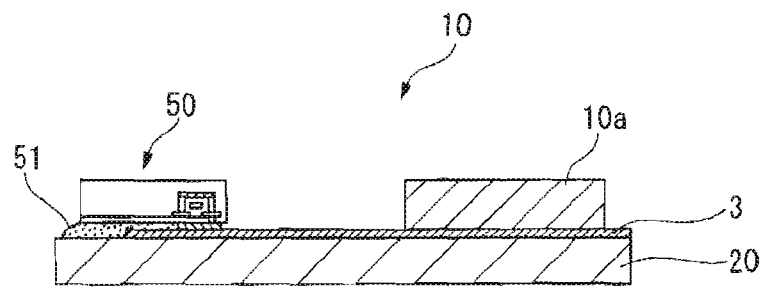
FIG. 2G describes a process of the manufacturing method according to one aspect of the invention.

Thereafter, a laser light is irradiated from the back surface of the temporal substrate 22 (the surface on which the TFTs are not formed) toward one side of the drive circuits 50 positioned in the area in which the adhesive 51 is applied. Consequently, the bonding between the atoms and molecules in the delaminating layer 23 weakens, and hydrogen atoms inside the delaminating layer 23 become molecules and then are separated from the link of crystal. In other words, the bonding power is entirely lost between the group of device chips T and the temporal substrate 22. Thus, where the laser light is irradiated, the group of device chips T can easily be removed. The group of device chips T is then removed from the temporal substrate 22 as shown in FIG. 2F, when the temporal substrate 22 is pulled away from the flexible substrate 20. At, the same time, the drive circuits 50a and 50b that belongs to the group of device chips T are transferred to the predetermined position on the flexible substrate 20.

The irradiated laser light travels along the L-shape in which the group of device chips T are arranged. In order to irradiate light in a high precision, the size of the spot irradiated by the laser light is preferably be smaller than the size of the minor axes of the drive circuits 50a and 50b.

Thereafter, the organic transistor 10a is formed. The source and the drain electrodes 30 of the organic TFTs 10a are formed on the flexible substrate 20. The organic semiconductor layer 31 is deposited thereon. In the manufacturing method according to this embodiment, among a series of processes, the number of processes in which a heat load is applied to the semiconductor layer of the organic TFTs 10a is the smallest, since the organic TFTs 10a on the flexible substrate 20 are formed after transferring the group of device chips T to the flexible substrate 20. Particularly, there is no process that involves washing or heating after the deposition of the organic semiconductor layer 31, therefore, the possibility of deterioration of the organic semiconductor layer 31 caused by fluid or heat subsides.

Since the organic semiconductor layer 31 is formed by the coating with liquid-phase process, the surface of the source and the drain electrodes 30 is required to be cleaned in a molecular level in a treatment prior to the liquid-phase process. Therefore, after the flexible substrate 20 on which the source and the drain electrodes 30 are formed is washed with water and an organic solvent, a surface treatment is carried out with oxygen plasma. In a standard method of such plasma treatment, an interior pressure of a chamber is reduced with a vacuum pump; gases such as oxygen, nitrogen, argon, and hydrogen are introduced therein for forming a plasma; and a substrate is exposed to that plasma. The plasma treatment may also be carried out in atmospheric pressure plasma.

After the oxygen plasma treatment, the organic semiconductor layer 31 is formed with the liquid-phase process, typically with inkjet (droplet ejection) method. Any one of low-molecular weight organic semiconductor materials and organic semiconductor polymers may be used for the organic semiconductor layer 31.

Examples of the organic polymer semiconductor materials include: poly(3-alkylthiophene), poly(3-hexylthiophene) (P3HT), poly(3-octylthiophene), poly(2,5-thienylene vinylene) (PVT), poly(paraphenylene vinylene) (PPV), poly (9,9-dioctylfluorene-co-bis-N,N'-(4-methoxyphenyl)-bis-N, N'-phenyl-1,4-phenylenediamine) (PFMO), poly(9,9-dioctylfluorene-co-benzothiadiazole) (BT), fluorenone-triarylamine copolymers, triarylamine polymers, and fluorenone-bithiophene copolymers.

Examples of the low-molecular weight organic semiconductors include: C60; metal phthalocyanine and substitute derivatives thereof; acene molecular materials such as anthracene, tetracene, pentacene, and hexacene; α-oligothiophenes such as quaterthiophene (4T), sexithiophene (6T), octithiophene (8T), dihexylquaterthiophene (DH4T), and dihexylsexithiophene (DH6T).

These materials may be used alone or in combination of two or more. Particularly, polymer organic semiconductor materials are preferable. The polymer organic semiconductor materials allow an easy film deposition, as well as a relatively easy orientation. In particular, materials such as fluorenone-bithiophene copolymer and poly-arylamin are preferable, since these materials are stable and reversibly oxidizable.

The insulation layer 32 is formed by spin coating the insulating polymer on the organic semiconductor layer 31 formed in the above manner. No particular limitation is imposed on the materials of the insulation layer 32, as long as known gate-insulating material is used. Here, it is suitable to use organic materials, typically polyolefin polymers such as polyvinylphenol, polyamide, polyethylene terephthalate, polystyrene, polyvinyl alcohol, polyvinylacetate, and polyisobutylene. Examples of film deposition include wet type methods such as spin coat and inkjet.

The making of the insulation layer 32 using the solution coating is required to be carried out without swelling or dissolution of the organic semiconductor layer 31 or the flexible substrate 20, caused by the solvent of the solution of the insulation layer 32. If the organic semiconductor layer 31 is soluble to the solvent, particular caution should be raised. The organic semiconductor layer 31 is soluble to aromatic hydrocarbons, since it is composed with conjugated molecules including aromatic ring or conjugated polymers. Therefore, for coating of the insulation layer 32, it is desirable to use hydrocarbons except for aromatic hydrocarbons, or, organic solvents of ketones, ethers, and esters. It is also preferable that the insulation layer 32 has a characteristic insoluble to the liquid material of the later-described gate electrodes 40.

Thereafter, the liquid material of the gate electrodes 40 (scanning lines 34b) is seeped as droplets toward the insulation layer 32.

The ejection of the liquid material is carried out by the inkjet method. With the inkjet method, the liquid material is ejected to the predetermined positions on the insulation layer 32, by operating the moving mechanism for moving the inkjet head relative to the flexible substrate 20, in the same manner as that of the formation of the metal film pattern 3. Here, the employed liquid material includes: a disperse liquid, a resultant of which low-resistant metal particles are mixed into a solvent; an aqueous dispersion of PEDOT (polyethylenedioxythiophene) or of metal choroids.

The scanning lines 34b are formed together with the gate electrodes 40. At this time, the gate electrodes 40 of the organic TFTs 10a and the contact units 55 of the drive circuits 50 (the terminals 56 of the drive circuits 50) are coupled with the scanning lines 34b. Here, the scanning lines 34b are the interconnections extending in the Y-direction in FIG. 1A. Therefore, in the inkjet method, the ink is ejected while scanning the inkjet head and the flexible substrate 20 in one direction. The scanning lines 34b are thus formed with minimum number of scans (minimum amount of traveling).

Subsequently, after forming an un-illustrated interlayer insulating film on the top layer so as to cover the gate electrodes 40 and the insulation layer 32, the semiconductor apparatus 10 according to the first embodiment is completed by delaminating the support substrate 21 adhered to the back surface of the flexible substrate 20. The similar materials used for the insulation layer 32 are used for the interlayer insulation film, and the similar wet type methods (liquid-phase process) such as spin coat and inkjet are employed.

The method for manufacturing the organic transistor with the top gate structure is described in the embodiment described above. However, this embodiment may also be applied to the one with a bottom gate structure. In the bottom gate structure, the gate electrode is employed as a lower electrode, and the source and the drain electrodes are formed on the gate electrode, having an insulation layer therebetween.

Second Embodiment

A second embodiment of the method for manufacturing a semiconductor apparatus will now be described.

Figure 4:
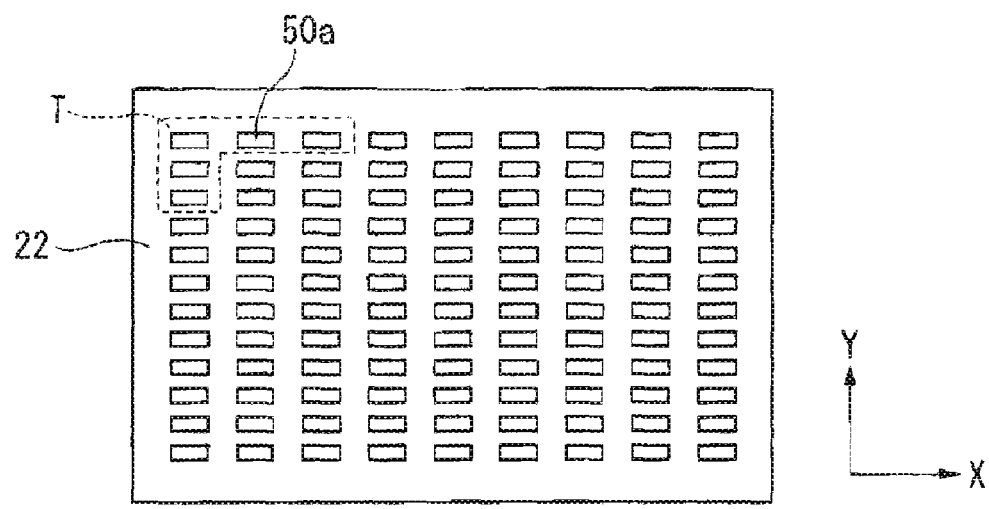
FIG. 4 is a schematic block diagram of a temporary substrate used in another embodiment of a manufacturing method according to one aspect of the invention.

The difference between the first embodiment and the second embodiment is the alignment of the drive circuits 50*a* formed on the temporal substrate 22 in the SUFTLA process. The alignment pattern is indicated in FIG. 4. FIG. 4 is a schematic plan view of the temporal substrate 22, viewed from the side on which the drive circuits 50*a* are formed.

The same type of drive circuits 50*a* are formed on the temporal substrate 22, all aligned pointing towards the same direction with even intervals, aligned vertically and horizontally. The details of how the drive circuits 50*a* are disposed in the same direction will be described as follows. The drive circuits 50*a* include structures in which the contact units are disposed for connection with other parts, as well as the structures of transistors. Thus, the structure of their major axis differs from that of the minor axis. Therefore, the drive circuits 50*a* is disposed on the temporal substrate 22, so that, the terminals, for instance, are aligned pointing towards the same direction.

One group of device chips T is selected from the drive circuits 50*a* formed on the temporal substrate 22, so that the selected group forms an approximately L-shaped group, as indicated in dotted line in FIG. 4. Thereafter, a single group of device chips T is delaminated as a unit, and is transferred onto the flexible substrate 20. Here, the selected drive circuits 50*a* that constitute the group of device chips T takes the same alignment as the drive circuits 50*a* on the flexible substrate 20. After adhering the terminal units of the drive circuits 50*a* to the flexible substrate 20 with the adhesive, the group of device chips T is transferred onto the flexible substrate 20 with laser light irradiation. This transfer process is carried out in the same process as that of the first embodiment.

Figure 5:
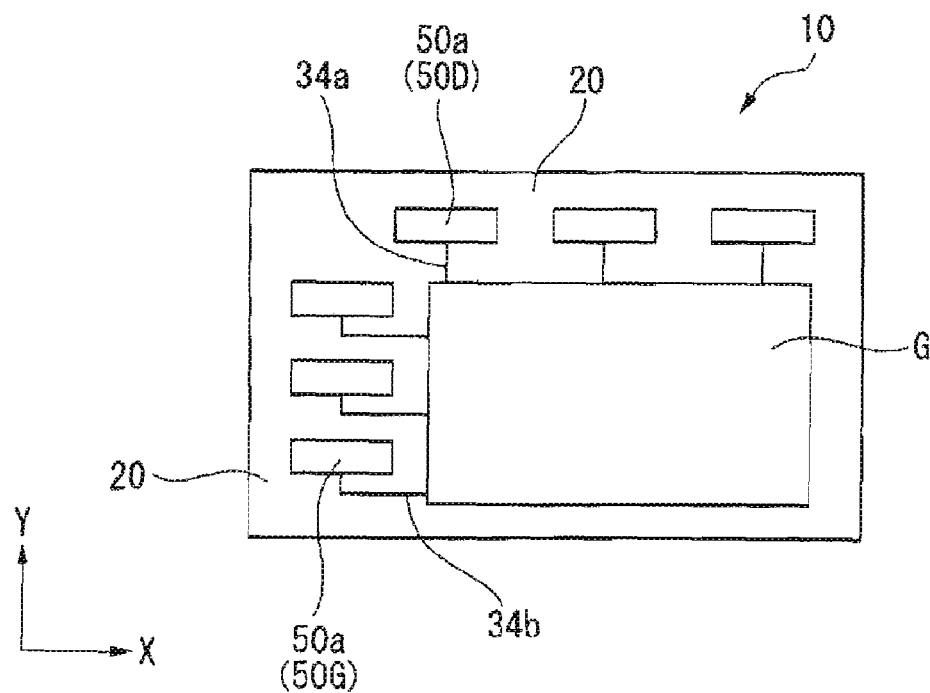
FIG. 5 is a schematic plan view of another embodiment of the semiconductor apparatus obtained by the manufacturing method according to one aspect of the invention.
Figure 6:
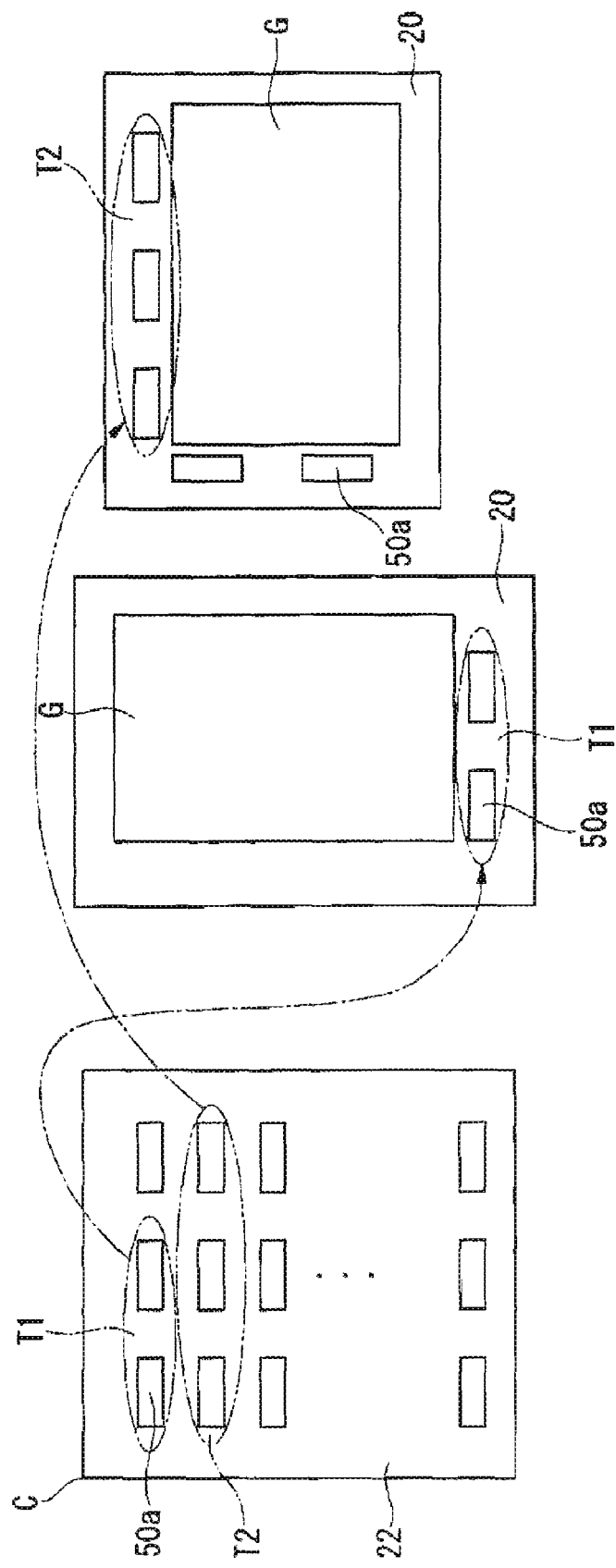
FIGS. 6A through 6C describe a process of the manufacturing method according to another aspect of the invention.

A schematic block diagram of the semiconductor apparatus 10 obtained with the second embodiment is shown in FIG. 5.

The semiconductor apparatus 10 according to the second embodiment is the same as that of the first embodiment, in a way that the drive circuits 50*a* are gathered and arrayed at the perimeter of the two sides of the flexible substrate 20. The difference is that data line drivers 50D connected to the data lines and scanning line drivers 50G connected to the scanning lines are disposed so that their longitudinal direction points toward the X direction.

Moreover, while, in the first embodiment, the terminal units of the drive circuits 50*a* and 50*b* are disposed in a direction facing the display area G, so that the length of the interconnections become the shortest, in the second embodiment, all the terminal units of the drive circuits 50*a* are disposed on the flexible substrate 20, pointing toward the same direction. In the second embodiment, terminals of the scanning line drivers 50G disposed along the Y direction in FIG. 5 do not face the display area G. Instead, the terminals are disposed in the direction turning 90 degrees away from the display area G (downward in the drawing). Thus, the scanning lines 34*b* coupled thereto are lead around the scanning line drivers 50G.

In the manufacturing method according to the second embodiment, the drive circuits 50*a* that are aligned pointing towards the same direction are formed in a simple alignment in the vertical and horizontal direction. The benefit of this is that the patterning in the manufacturing process of the temporal substrate 22 is very simple. Moreover, a very large number of drive circuits 50*a* can be formed on the temporal substrate 22, and the alignment of the group of device chips T to be transferred can be changed in every transfer. Consequently, wide varieties of semiconductor devices are manufactured with small amount of materials and energy, without having to form on the temporal substrate 22 the group of device chips T in every sort of alignment pattern.

Third Embodiment

The third embodiment of a method for manufacturing a semiconductor apparatus will now be described.

What this embodiment differs from the above-described second embodiment is that the transfer process is made into two processes. The temporal substrate 22 is formed in the same manner as that of the second embodiment, as indicated in FIG. 4. In this embodiment, two groups of device chips T1 and T2 are selected, and they are transferred separately onto the flexible substrate 20. FIGS. 6A through 6C schematically describe the steps of the transfer process according to this embodiment.

As shown in FIG. 6A, a plurality of drive circuits 50*a* are formed on the temporal substrate 22. These drive circuits 50*a* are all disposed in the same direction with even intervals, aligned vertically and horizontally.

FIG. 6B shows the flexible substrate 20 and the group of device chips T1 to be transferred in a first transfer process.

Two drive circuits 50*a* disposed at the outermost side of the temporal substrate 22 are selected, so as to constitute the group of device chips T1. The transfer is carried out so that each contact unit of the group of device chips T1 is coupled with a contact unit prepared on the flexible substrate 20. In the example shown in FIG. 6B, the transfer of the first transfer process is carried out in a manner that the row of the group of device chips T1 becomes parallel to the minor axis of the flexible substrate 20.

The group of device chips T1 selected in the first transfer process is first selected from the row arranged at the outermost side of the temporal substrate 22, as well as from the ones closer to a corner C of the temporal substrate 22. The reason for the above is to utilize the drive circuits 50*a* without wastage, as well as to prevent the flexible substrate 20 from contacting the drive circuits 50*a* remaining on the temporal substrate 22. Moreover, by arranging one side of the flexible substrate 20 to be in parallel with the major axis of the drive circuits 50*a*, it is possible to reduce the space on the perimeter of the flexible substrate 20 taken by the group of device chips T1 transferred thereto.

The group of device chips T2 selected in a second transfer process is selected from the row arranged at the second outermost row subsequent to that of the group of device chips T1. In other words, referring back to FIG. 6A, the group is selected from the left side of the second row, when counted from the top row of the drive circuits 50*a*. In the third embodiment, there are only three drive circuits 50*a* disposed in the first row. Thus the group of device chips T2 cannot further be selected from of the first row. However, if multiple of drive circuits 50a are formed in the first row, the group of device chips T2 may also be selected from the first row.

The transfer in the second transfer process is carried out, similar to the first transfer process, so that each contact unit of the drive circuits 50a faces the display area, and so that the group of device chips T2 are arranged, forming an approximately L-shaped array together with the group of device chips T1 that is already transferred. At this time, the flexible substrate 20 is rotated in the transfer by 90 degrees in the horizontal plane. As shown in FIG. 6C, the drive circuits are arranged approximately in an L-shape surrounding the display area G, by transferring the group of device chips T2 so that the line of the group becomes parallel to the major axis of the flexible substrate 20.

As described, by dividing the transfer process into two processes, the groups of device chips T1 and T2 become linear, which, compared to the case where the group of device chips T is L-shaped, provides more freedom upon selecting the group of device chips T from the temporal substrate 22. Therefore, the drive circuits 50a formed on the temporal substrate 22 are transferred with less wastage. Moreover, according to the third embodiment, the both groups of device chips T transferred are arranged to face the display area G at their long sides. Therefore, the interconnections, extended and coupled from the display area G to the groups of device chips T, are linearly let out in a short distance, so as to couple with the drive circuits 50a. Therefore, the space the interconnections take up in the peripheral circuit part in the semiconductor apparatus 10 is decreased, allowing the manufacturing of a light and small-sized semiconductor apparatus.

Further, according to this embodiment, the scanning by a laser light used in the transfer process can be set to one direction, providing a benefit that a single mask is sufficient for irradiation of light to the group of device chips T to be transferred.

In the example shown in FIGS. 6A through 6C, the flexible substrate 20 is rotated. However the manufacturing method according to the embodiments of the invention is not limited thereto, and may obviously include the rotation of the temporal substrate 22. Moreover, since the support substrate 21 is adhered to the back surface of the flexible substrate 20, the handling thereof is extremely easy in the substrate rotation as well as in all of the transfer processes.

As described above, in the manufacturing method according to these embodiments of the invention, many groups of device chips T are formed on a single temporal substrate 22, allowing the manufacturing of semiconductor apparatus at a low cost. Moreover, the less number of temporal substrates 22 are used in the manufacturing, suppressing the usage of material and energy to the minimum. For instance, if the number of the groups of device chips T that can be formed on a single temporal substrate 22 grows by a factor of ten, then the necessary number of the temporal substrate 22 is reduced to one tenth of the original, thereby suppressing the material and energy by at most one tenth.

The support substrate 21 adhered to the flexible substrate 20 allows the handling of the flexible substrate 20 as a rigid substrate in each manufacturing process, making the handling easier. Moreover, the alignment precision in each process becomes extremely easy, since the warp or swell of the flexible substrate 20 is eliminated by the support substrate.

In these embodiments, the organic TFTs are used as the switching devices provided with an organic semiconductor layer, and the circuits LTPS-TFTs are used as the driving circuits. However, the method for manufacturing a semiconductor apparatus according to the embodiments of the invention is not limited thereto.

Electro-Optical Apparatus

Figure 7:
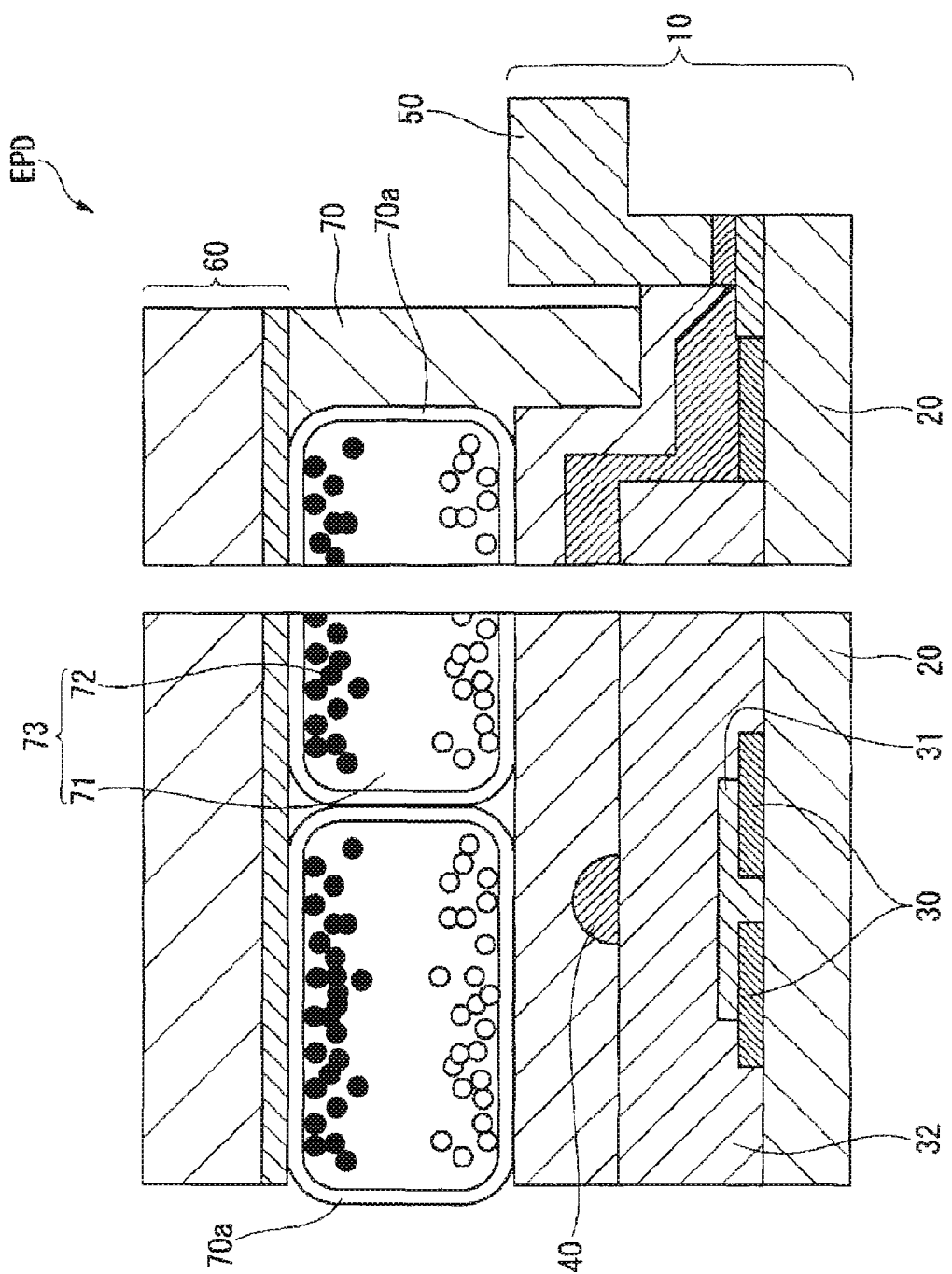
FIG. 7 is an illustration indicating an example of an electro-optical apparatus according to another aspect of the invention.

An electro-optical apparatus according to one embodiment in the invention will now be described with reference to FIG. 7. Here, as an electro-optical apparatus, an electrophoresis display apparatus formed using the aforementioned semiconductor apparatus is described. This electrophoresis display apparatus EPD is formed including: the semiconductor apparatus 10 as a TFT substrate; a counter substrate 60 disposed facing the semiconductor apparatus 10; and an electrophoresis layer (electro-optical layer) 70 disposed between the semiconductor apparatus 10 and the counter substrate 60.

Here, the electrophoresis layer 70 includes a plurality of microcapsules 70a. These microcapsules 70a are formed with a resin film, and the size thereof is approximately the same as that of one pixel. The plurality of them is disposed so as to cover the entire display area. Here, the display area is covered without gaps by the microcapsules 70a, since the adjacent microcapsules 70a are in close contact to one another. An electrophoresis disperse liquid 73 including a disperse medium 71 and electrophoresis particles 72 is sealed into each of the microcapsules 70a.

Hereafter, the electrophoresis disperse liquid 73 including the disperse medium 71 and the electrophoresis particles 72 will be described.

The electrophoresis disperse liquid 73 has the electrophoresis particles 72 dispersed into the disperse medium 71 colored with a dye. The electrophoresis particles 72 are approximately spherical fine particles, with diameters from approximately 0.01 µm to 10 µm, and have a hue (including white and black) different from the hue of the disperse medium 71. The electrophoresis particles 72 composed with oxides or hydroxides each have an inherent surface isoelectric point, and the surface electric charge density (level of electrification) changes in accordance with the hydrogen-ion exponent pH of the disperse medium 71.

The surface isoelectric point is a state expression where the algebraic sum of the electric charge of an amphoteric electrolyte in aqueous solution and the hydrogen-ion exponent pH is zero. For instance, if the pH of the disperse medium 71 equals the surface isoelectric point of the electrophoresis particles 72, the effective electric charge of the particles becomes zero, and the particles do not react to an external electric field. Further, if the pH of the disperse medium 71 is lower than the surface isoelectric point of the particles, the surface of the particles becomes positively charged by following equation (1). Contrarily, if the pH of the disperse medium 71 is higher than the surface isoelectric point of the particles, the surface of the particles becomes negatively charged by following equation (2).

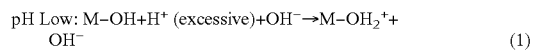

$$\text{pH Low: M-OH} + \text{H}^+ \text{ (excessive)} + \text{OH}^- \rightarrow \text{M-OH}_2^+ + \text{OH}^- \quad (1)$$

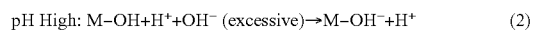

$$\text{pH High: M-OH} + \text{H}^+ + \text{OH}^- \text{ (excessive)} \rightarrow \text{M-O}^- + \text{H}^+ \quad (2)$$

Additionally, when a difference between the pH of the disperse medium 71 and the surface isoelectric point of the particles is increased, the charge quantity of the particles increases according to the reacting equations (1) and (2). However, when the difference exceeds the predefined value, the charging is saturated and the charge quantity does not change even if the value of the pH is changed further. While the variation in the value of this difference depends on type, size and shape of the particles, those of ordinary skill in the art generally think that charge quantity of particles regardless of their type, size, and shape, the charge quantity is saturated at the value approximately "1" or more.

Examples of the electrophoresis particles 72 include materials such as: titanium dioxide, zinc oxide, magnesium oxide, red iron oxide, aluminum oxide, black low valence titanium oxide, chromium oxide, boehmite, FeOOH, silicon dioxide, magnesium hydroxide, nickel hydroxide, zirconium oxide, and copper oxide.

The electrophoresis particles 72 may be used not only as independent particles, but also in the state of surface modification. Examples of the methods for such surface modification include: coating the surface of the particles with polymers such as acrylic resin, epoxy resin, polyester resin, and polyurethane resin; coupling using coupling agents composed with materials such as silanes, titanates, aluminums, and fluorides; and graft polymerization with acrylic monomer, styrene monomer, epoxy monomer, and isocyanate monomer. These treatments may be used alone or in combination of two or more.

The disperse medium 71 may contain non-aqueous organic solvents such as hydrocarbons, halogen hydrocarbons, and ethers. The non-aqueous organic solvents are colored with dyes such as spirit black, oil yellow, oil blue, oil green, very first blue, macrorex blue, oil brown, sudan black, and first orange, so that the disperse medium 71 has a hue different from that of the electrophoresis particles 72.

Such electrophoresis display apparatus with the above structure includes the previously described semiconductor apparatus 10, and therefore made into a flexible display apparatus manufactured at a low cost, low temperature, and with low energy, while provided with flexibility.

The electro-optical apparatus utilizing the semiconductor apparatus in the invention is not limited to the described embodiments, and may obviously be used suitably to apparatuses such as organic EL displays.

Electronic Appliance

The above-described electrophoresis display apparatus is applied to various electronic appliance provided with display units. Examples of electronic apparatuses provided with the electrophoresis display apparatus mentioned above will now be described.

Figure 8:
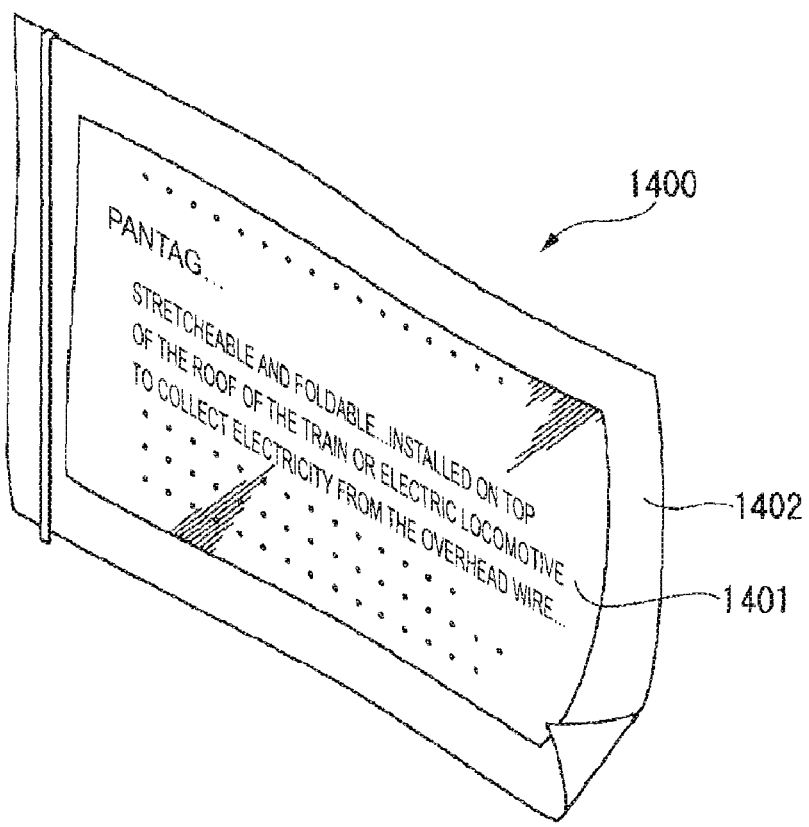
FIG. 8 is an illustration indicating an example of an electronic appliance according to another aspect of the invention.

An example, in which the electrophoresis display apparatus is applied to a flexible electronic paper, is explained. FIG. 8 is a perspective view illustrating the structure of this electronic paper. An electronic paper 1400 includes the electrophoresis display apparatus according to the embodiment of the invention as a display unit 1401. The electronic paper 1400 is formed including a body 1402 formed with a rewritable sheet that has a similar texture and flexibility to a paper.

Figure 9:
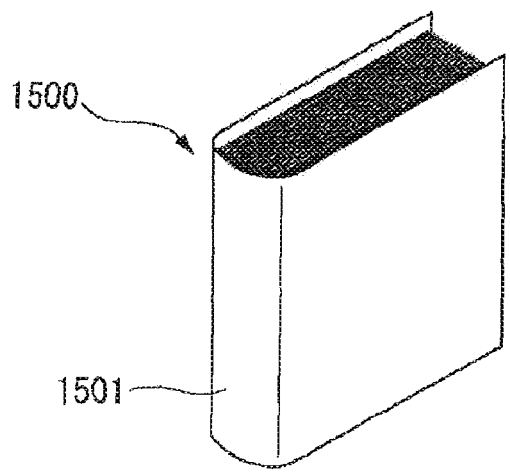
FIG. 9 is an illustration indicating another example of the electronic appliance according to the above aspect of the invention.
Figure 10:
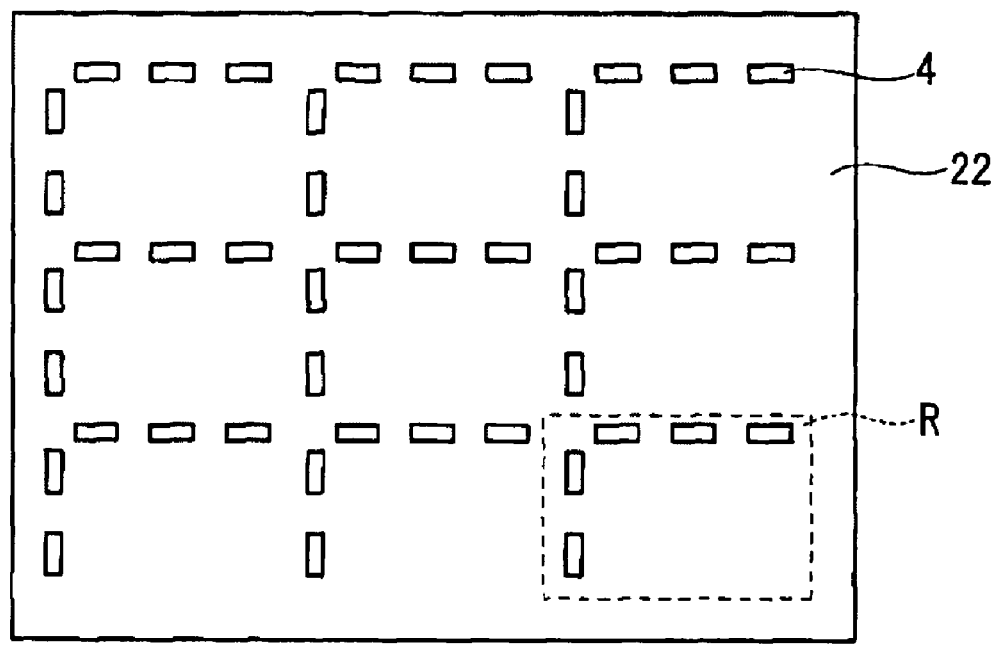
FIG. 10 is a schematic view of an example of the temporary substrate used in manufacturing the semiconductor apparatus.

FIG. 9 is a perspective view illustrating the structure of the electronic notebook. An electronic notebook 1500 includes several pages of the electronic paper 1400 shown in FIG. 8 bundled together, tucked in a cover 1501. The cover 1501 is provided with an un-illustrated display data input means for inputting display data transmitted from, for instance, an external apparatus. This allows modification and refreshing of the display contents, in accordance with the display data, without unbundling the electronic papers.

In addition to the above examples, other examples include appliances such as: a liquid crystal television, a viewfinder type or a direct-view monitor type video tape recorder, a car navigation apparatus, a pager, an electronic notebook, a calculator, a word processor, a workstation, a video phone, a point-of-sale terminal, and a touch panel. The electro-optical device according to the embodiments of the invention may also be applied for those electronic appliances.

The entire disclosure of Japanese Patent Application No: 2006-194734, filed Jul. 14, 2006 is expressly incorporated by reference herein.

What is claimed is:

1. A method for manufacturing a semiconductor apparatus having a plurality of device chips aligned approximately in an L-shape at a perimeter of the two adjacent sides of a flexible substrate and a circuit coupled with a device chip, the method comprising:

aligning, on a temporal substrate that has a first long side and a second long side opposing the first long side, a plurality of groups of device chips, each group of device chips including a plurality of device chips aligned in an L-shape;

arranging the plurality of groups of device chips in a plurality of arrays on the temporal substrate, each array of device chips arranged in a band-shape, from the first long side to the second long side of the temporal substrate, each L-shape formed by each group of device chips pointing towards a same direction, a front of the band-shape being a corner of a perimeter of a group of device chips closest to a corner of the temporal substrate, one group of device chips being within an L-shape of another group of device chips;

delaminating a group of device chips as one unit from the temporal substrate, and transferring onto the surface of the flexible substrate; and coupling each of the device chips in the group of device chips with the circuit on the flexible substrate.

2. The method for manufacturing a semiconductor apparatus according to claim 1, further comprising, adhering a support substrate to a back surface of the flexible substrate, prior to transferring the group of device chips to the flexible substrate.

3. The method of manufacturing a semiconductor apparatus according to claim 1, wherein the semiconductor apparatus is an electro-optical apparatus.

4. A method for manufacturing a semiconductor apparatus including a plurality of device chips aligned approximately in an L-shape at a perimeter of the two adjacent sides of a flexible substrate and a circuit coupled with a device chip, the method comprising:

forming a plurality of device chips in an alignment on a temporal substrate in a plurality of arrays, the temporal substrate having a first long side and a second long side opposing the first long side, each array of device chips formed by a plurality of device chips arranged in a band-shape, from the first long side to the second long side of the temporal substrate;

selecting a first group of device chips from the plurality of device chips, an alignment of the first group of device chips forming approximately an L-shape;

selecting a second group of device chips from the plurality of device chips, an alignment of the second group of device chips forming approximately an L-shape, such that the second group of device chips is within the L-shape of the first group of device chips and directly adjacent to the first group of device chips;

delaminating and transferring the first group of device chips as one unit onto the flexible substrate; and coupling each of the device chips that are transferred with the circuit.

5. A method of manufacturing a semiconductor apparatus having a first plurality of driving chips formed on a first substrate, the first plurality of driving chips being composed of a first group formed in a first direction and a second group formed in a second direction of the first substrate, the first direction intersecting with the second direction, each of the first plurality of driving chips being connected to a wiring pattern formed on the first substrate, the method comprising:

forming the first plurality of driving chips on a second substrate such that the first group is aligned in a third direction of the second substrate, the second group is formed in a fourth direction of the second substrate and an area is formed between the first group and the second group;

forming a second plurality of driving chips composed of a third group formed in the third direction and a fourth group formed in the fourth direction on the second substrate such that the third group and the fourth group are formed in parallel and directly adjacent to the first group and the second group, respectively, and are formed within the area; and transferring the first plurality of driving chips to the first substrate, each of the first plurality of driving chips being configured to be connected to the wiring pattern.

6. The method of manufacturing the semiconductor apparatus according to claim 5, the second substrate having a first long side and a second long side, the first group being aligned in parallel with the first long side and the second group being aligned in parallel with the second long side.

7. The method of manufacturing the semiconductor apparatus according to claim 5, the transferring of the first plurality of driving chips being conducted at the same time.

8. The method of manufacturing the semiconductor apparatus according to claim 5, the first group and the second group forming an approximately L shape.

9. The method of manufacturing the semiconductor apparatus according to claim 5, further comprising:

forming a supporting substrate to an opposite side of the first substrate on which the wiring pattern is formed before the transferring of the first plurality of driving chips.

10. The method of manufacturing the semiconductor apparatus according to claim 5, the first substrate further including a display area, the first plurality of driving circuits being formed at a periphery of the display area.

11. The method of manufacturing a semiconductor apparatus according to claim 5, wherein the semiconductor apparatus is an electro-optical apparatus.

12. The method of manufacturing the electro-optical apparatus according to claim 11, the electro-optical apparatus including an electrophoresis display apparatus.

* * * * *